US008580354B2

(12) United States Patent
Fu et al.

(10) Patent No.: US 8,580,354 B2
(45) Date of Patent: Nov. 12, 2013

(54) PLASMA TREATMENT OF SUBSTRATES PRIOR TO DEPOSITION

(75) Inventors: Xinyu Fu, Fremont, CA (US); Jick M. Yu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 8 days.

(21) Appl. No.: 13/209,760

(22) Filed: Aug. 15, 2011

(65) Prior Publication Data

US 2011/0300720 A1    Dec. 8, 2011

Related U.S. Application Data

(62) Division of application No. 11/776,131, filed on Jul. 11, 2007, now Pat. No. 8,021,514.

(51) Int. Cl.
| | |
|---|---|
| C23C 14/02 | (2006.01) |
| C23C 14/16 | (2006.01) |
| C23C 14/58 | (2006.01) |
| B05D 3/06 | (2006.01) |
| H05H 1/24 | (2006.01) |
| H05H 1/46 | (2006.01) |
| C23C 14/18 | (2006.01) |

(52) U.S. Cl.
USPC ........... 427/539; 427/534; 427/562; 427/564; 438/584; 438/653

(58) Field of Classification Search
None
See application file for complete search history.

(56) References Cited

U.S. PATENT DOCUMENTS

| | | | |
|---|---|---|---|
| 4,452,679 A * | 6/1984 | Dunn et al. | 204/164 |
| 5,545,289 A | 8/1996 | Chen et al. | |
| 5,885,751 A | 3/1999 | Weidman et al. | |
| 6,395,643 B1 | 5/2002 | Knoot | |
| 6,553,933 B2 | 4/2003 | Powell et al. | |
| 6,634,313 B2 | 10/2003 | Hanawa et al. | |
| 6,773,930 B2 | 8/2004 | Summerfelt et al. | |
| 6,897,119 B1 * | 5/2005 | Sneh et al. | 438/400 |
| 7,190,512 B2 | 3/2007 | Sakai et al. | |
| 7,459,392 B2 | 12/2008 | Johnston et al. | |
| 7,659,204 B2 * | 2/2010 | Tang et al. | 438/679 |
| 7,695,567 B2 * | 4/2010 | Fu | 134/1.2 |
| 7,704,887 B2 * | 4/2010 | Fu et al. | 438/710 |

(Continued)

FOREIGN PATENT DOCUMENTS

| | | | | |
|---|---|---|---|---|
| JP | 01-293521 A | * 11/1989 | | 427/571 |
| | 4452679 | | | |
| WO | WO 2007/043128 A1 | * 4/2007 | | H01L 21/8246 |

OTHER PUBLICATIONS

Webster's Ninth New Collegiate Dictionary; Merriam-Webster Inc., publishers; Springfield, Massachusetts, USA; 1990 (no month); excerpt p. 746.*

*Primary Examiner* — Marianne L Padgett
(74) *Attorney, Agent, or Firm* — Charles S. Guenzer

(57) ABSTRACT

A plasma processing chamber particularly useful for pre-treating low-k dielectric films and refractory metal films subject to oxidation prior to deposition of other layers. A remote plasma source (RPS) excites a processing gas into a plasma and delivers it through a supply tube to a manifold in back of a showerhead faceplate. The chamber is configured for oxidizing and reducing plasmas in the same or different processes when oxygen and hydrogen are selectively supplied to the RPS. The supply tube and showerhead may be formed of dielectric oxides which may be passivated by a water vapor plasma from the remote plasma source. In one novel process, a protective hydroxide coating is formed on refractory metals by alternating neutral plasmas of hydrogen and oxygen.

5 Claims, 3 Drawing Sheets

(56) References Cited

U.S. PATENT DOCUMENTS

| | | |
|---|---|---|
| 8,021,514 B2 * | 9/2011 | Fu et al. .................. 156/345.33 |
| 2003/0168588 A1 | 9/2003 | Brailove et al. |
| 2003/0194510 A1 | 10/2003 | Nguyen et al. |
| 2004/0014325 A1 | 1/2004 | Laermer et al. |
| 2004/0179980 A1 | 9/2004 | Pattekar et al. |
| 2004/0203251 A1 | 10/2004 | Kawaguchi et al. |
| 2005/0173569 A1 | 8/2005 | Noorbakhsh et al. |
| 2006/0090700 A1 | 5/2006 | Satoh et al. |
| 2007/0117397 A1 | 5/2007 | Fu et al. |
| 2008/0096381 A1 | 4/2008 | Han et al. |
| 2008/0185623 A1 * | 8/2008 | Sashida .................. 257/295 |
| 2008/0233691 A1 | 9/2008 | Cheng et al. |
| 2008/0237029 A1 * | 10/2008 | Tang et al. .................. 204/164 |
| 2008/0261405 A1 * | 10/2008 | Yang et al. .................. 438/711 |

* cited by examiner

PLASMA TREATMENT OF SUBSTRATES PRIOR TO DEPOSITION

RELATED APPLICATION

This application is a division of Ser. No. 11/776,131, filed Jul. 11, 2007, incorporated herein by reference, and now issued as U.S. Pat. No. 8,021,514.

FIELD OF THE INVENTION

The invention relates generally to plasma processing of substrates such as semiconductor integrated circuits. In particular, the invention relates to a plasma treatment chamber having a remote plasma source.

BACKGROUND ART

Plasma processing is widely used in the fabrication of semiconductor integrated circuits including some of the fundamental processes of plasma etching and deposition including plasma enhanced chemical vapor deposition (PECVD) and magnetron sputtering.

Vias are common structures used to vertically connect different metallization layers in integrated circuit. As illustrated in the cross-sectional view of FIG. 1, a lower dielectric layer 10 has a conductive feature 12 formed in its surface. An upper dielectric layer 14 is deposited over the lower dielectric layer 10 and its conductive feature 12 typically in a PECVD process. Photolithography including the patterning of a photoresist layer etches a via hole 16 through the upper dielectric layer 14 down to the conductive feature 12. The via hole 16 is filled with a metal to electrically connect the conductive feature 12 to another layer of metal formed above the upper dielectric layer 14. To prevent the metal from diffusing from the via 16 into the dielectric layer 14, a thin conformal barrier layer is deposited onto at least the sidewalls of the via hole 16 prior to the metal filling. Typical barrier materials are titanium for aluminum metallization and tantalum for copper metallization along with nitrides of the barrier metal. Magnetron sputtering is often used for depositing both the barrier metal and its nitride. This process for forming vertical interconnects may be repeated several times for the increasing number of metallization layers required for advanced logic circuits. In the lowest metallization level, the via is properly called a contact. In this case, a silicon layer replaces the lower dielectric layer 10 and the conductive feature may be a doped region in the silicon layer with accompanying contact layers such as silicides.

Many advanced integrated circuits replace the simple illustrated via with a dual-damascene structure having a narrow via formed in the lower portion of the dielectric layer and a connecting wider trench formed in the upper portion. The trench may extend axially over significant distances to provide horizontal interconnects in conjunction with the vertical interconnect of the via. The via and trench usually require separate etching steps but a single barrier deposition step and a single metal fill step are performed. The dual-damascene structure is particularly advantageous for copper metallization since copper is not readily etched. Instead, electrochemical plating (ECP) or related plating process fills the via and trench with copper and forms copper above the dielectric layer 14. Chemical mechanical polishing (CMP) removes the excess copper outside of the trench. The copper-filled trench may act as the conductive feature 12 in the lower metallization layer. Plating copper, however, requires a thin copper seed layer between the barrier layer to nucleate the copper formation and providing a plating electrode. Magnetron sputtering is most commonly used for depositing the copper seed layer. Further discussions of the via structure will apply equally well to dual-damascene structures, which often co-exist on the same chip.

In addition to the principal fabrication steps, plasma processing is also used for plasma treating pre-existing layers other than removing exposed layers as is done in etching. Plasma ashing performed after an etching process removes the patterned photoresist, typically composed of a carbonaceous polymer. Often prior to a deposition step, plasma pre-cleaning removes photoresist residues 18 and other contaminants settling on the via sidewalls wafer either because of prior processing or while the wafer is removed from the high-vacuum processing environment. Plasma pre-cleaning may also remove a native oxide layer 20 that has developed on exposed metal layers. Surface residues 22 may also form above the lip of the via hole.

Plasma treatments have recently been beneficially applied to low-k dielectric materials used to as the inter-level dielectric layer 14 in order to reduce capacitive coupling between narrowly spaced features and layers. Advanced low-k dielectrics having dielectric constants of 3 and below may have a significant carbon content and may also be porous to further decrease the dielectric constant. When vias are etched through dielectric layer to provide for vertical interconnects, the plasma etching may damage the soft low-k dielectric material. Further, the porous dielectric material may be unsatisfactory as a base for depositing subsequent barrier and metal layers. Accordingly, the practice has developed of both plasma cleaning the damaged low-k dielectric and of stuffing oxygen into the pores of the etched low-k material prior to the next deposition.

SUMMARY OF THE INVENTION

A plasma processing chamber may be configured to perform both reducing and oxidizing plasma processing, for example, pre-cleaning of an etched substrate prior to metal deposition or treatment of a porous dielectric layer exposed in the etching.

In one embodiment of the chamber, a remote plasma source is mounted on the chamber and its output is supplied through a supply tube to a gas manifold in back of the faceplate of a showerhead in opposition to a pedestal supporting the wafer. An ion filter may be fitted to the supply tube. The supply tube and the manifold may be lined with an oxide dielectric such as alumina or quartz and the faceplate may be formed of such materials. Sources of hydrogen gas, oxygen gas, and water vapor are connected through respective metering valves to the input to the remote plasma source.

The invention enables the formation of an hydroxide film by first exposing the substrate to a neutral hydrogen plasma and then to a neutral oxygen plasma. The hydroxide film is particularly useful to protect a refractory metal layer only partially covered by a thin copper seed layer and thus subject to local oxidation.

DETAILED DESCRIPTION OF THE PREFERRED EMBODIMENTS

Many popular plasma treatments in the fabrication of semiconductor integrated circuits may be divided into oxidizing treatments and reducing treatments. For plasma treatments, oxygen is the most commonly used oxidizing agent when the chemical reactions of halogens need to be avoided and hydrogen is the most commonly used reducing agent. One difficulty of plasma treatments, particularly of porous low-k dielectric material, is that a plasma generated adjacent the wafer, often called an in situ or local plasma, contains a high number of electrically charged ions, for example, of oxygen ions $O^+$ or $O_2^-$ or hydrogen ions $H^+$. Even a wafer left electrically floating tends to develop a significant negative self-bias in the presence of a locally generated plasma. As a result, the positively charged ions within the plasma are accelerated towards the wafer and strike the wafer with high energy, often sufficient to damage the already deposited material and possibly sputter material from one section of the developing integrated circuit to another.

For these reasons, the technology of a remote plasma source (RPS) has been developed to generate a plasma of the treatment gas at a location remote from the wafer, often outside of the main vacuum processing chamber. The plasma then diffuses into the processing chamber to treat the wafer without the generation of a local plasma and the attendant negative self-bias on the wafer. Furthermore, at least in the case of hydrogen, ion filters may be placed between the remote plasma source and the vacuum chamber to remove the hydrogen ions from the diffusing plasma and leave only neutral hydrogen radicals, mostly $H^*$. Radicals are highly reactive but are not subject to electrostatic acceleration towards a biased wafer. They perform a soft etch or other treatment as opposed to the hard etch or sputtering often resulting from heavy charged particles. However, attaching a remote plasma source to a vacuum processing chamber may present significant problems dependent upon the treatment gas being excited into a plasma to process the wafer.

Figure 1:
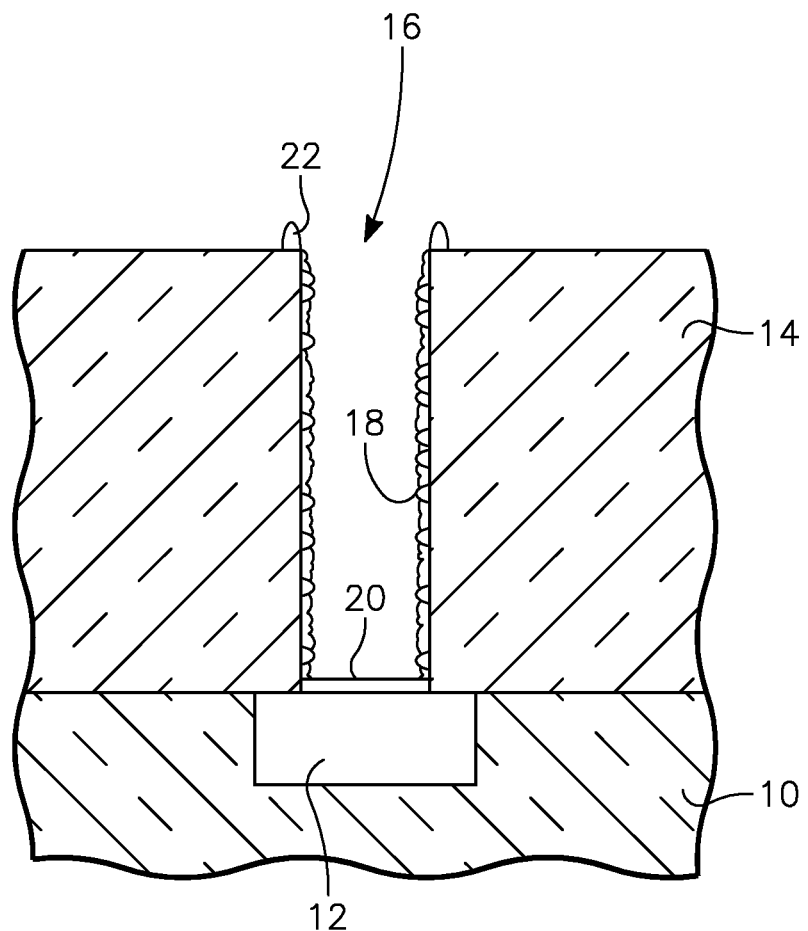
FIG. 1 is a cross-sectional view of a via showing the formation of residue and oxide.
Figure 2:
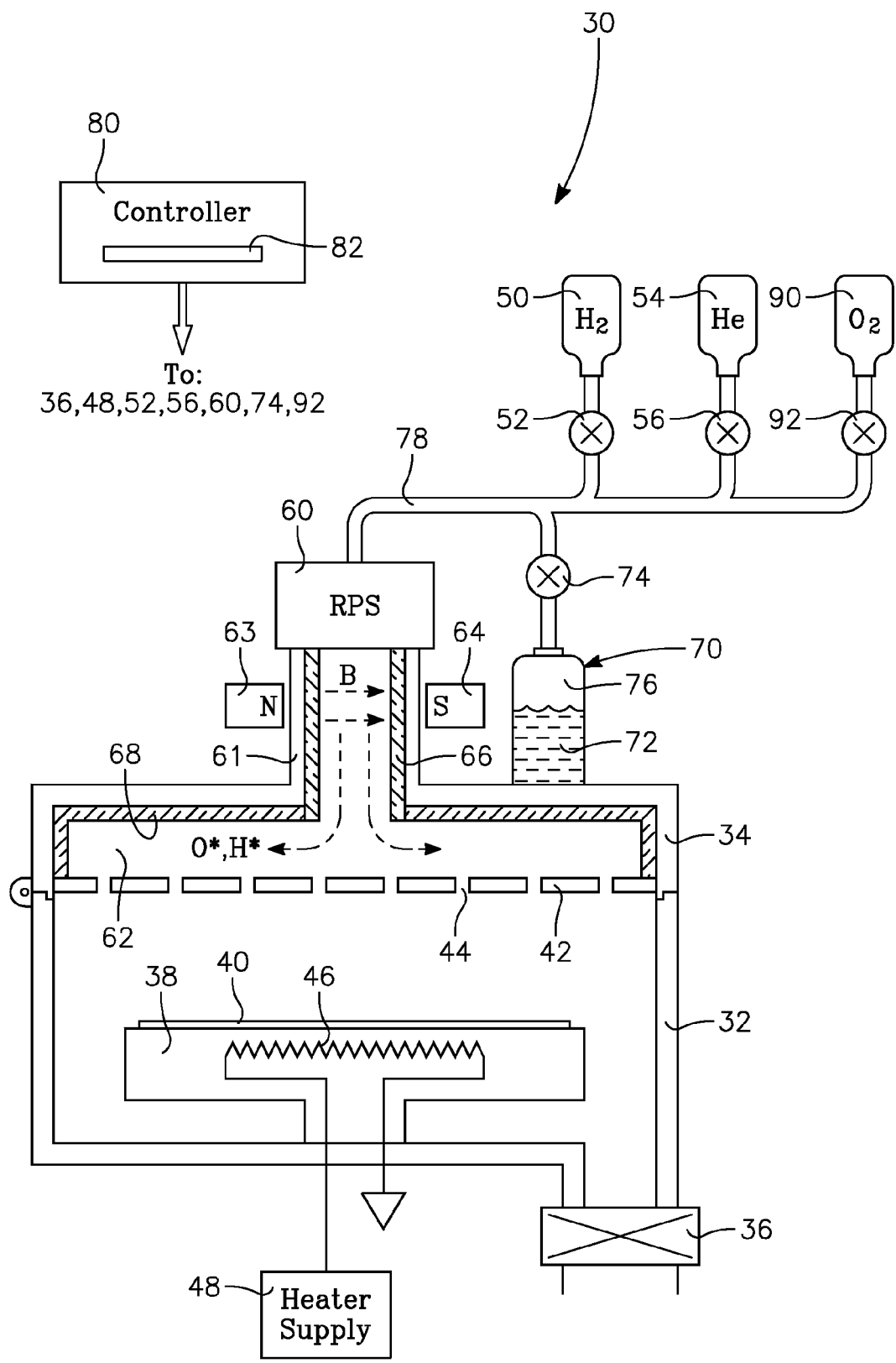
FIG. 2 is a schematic cross-sectional view of plasma processing chamber usable with the invention.

A cleaning chamber 30 illustrated in the cross-sectional view of FIG. 2 includes a vacuum chamber 32 having an openable lid 34 and pumped by a vacuum pump system 36. A pedestal 38 within the chamber 32 supports a wafer 40 to be cleaned in opposition to a gas showerhead including a showerhead faceplate 42 supplying a process gas into the vacuum chamber 32 through a large number of apertures 44 formed in and distributed over the faceplate 42. The pedestal 38 may include a resistive heater 46 selectively supplied with current from a heater power supply 48 to raise the temperature of the wafer 40 to a desired etching or pre-cleaning temperature.

The process gas for one type of cleaning is either pure hydrogen gas ($H_2$), which is supplied from a hydrogen gas source 50 through a mass flow controller 52, or a combination of hydrogen and helium (He), which is supplied from a helium gas source 54 through another mass flow controller 56. A remote plasma source 60 receives the gas and excites it into a plasma. The remote plasma source 60 may be a capacitive exciter having a pair of electrodes positioned on opposed sides of a delivery tube delivering the process gas and driven by an RF power source or an inductive exciter having an inductive coil wrapped around the delivery tube and driven by the RF power source. Other types of plasma generators are possible. The excited gas or plasma is delivered though a supply tube 61 to a gas manifold 62 in back of the showerhead faceplate 42. The excited gas is thus delivered uniformly through the showerhead faceplate 42 to the wafer 40 being cleaned.

The remote plasma source 60 is located upstream of the vacuum chamber 32. An ion filter is disposed along the path between the remote plasma source 60 and the manifold 62 to remove any hydrogen ions $H^+$ so that only neutral hydrogen radicals $H^*$ of the plasma reach the wafer 40. The ion filter may include two magnets 63, 64 disposed in opposition across the supply tube 61 to project a magnetic field B across the tube's interior to deflect or capture the charged hydrogen ions. Since the plasma generating unit of the remote plasma source 60 is not completely efficient, neutral but unexcited hydrogen molecules $H_2$ also reach the wafer 40 but they are much less efficient than the hydrogen radicals in a reducing reaction. Other forms of ion filters may be used.

A removable dielectric tube liner 66 may be placed inside the supply tube 61 and a dielectric chamber liner 68 may cover the walls of the manifold 62 to protect them and to reduce recombination of the hydrogen radicals. The liners 66, 68 are typically oxide ceramics. For example, the tube liner 66 may be composed of alumina ($Al_2O_3$) and the manifold liner 68 and the showerhead faceplate 42 may be composed of quartz ($SiO_2$). However, the reducing hydrogen chemistry may also etch the oxide liners 66, 68 and showerhead faceplate 42.

Water passivation of the liners 66, 68 and showerhead faceplate 42 is described by Fu in patent application Ser. No. 11/351,676, filed Feb. 10, 2006, now published as patent application publication 2007/0190266, and incorporated herein by reference. A vacuum-sealed ampoule 70 containing a pool 72 of liquid water is mounted on the chamber lid 34 and a mass flow controller 74 meters water vapor from the ampoule 70 into the remote plasma source 60. The vapor pressure of water at room temperature is about 20 Torr, which is well above the usual vacuum levels at which the remote plasma source 60 operates. Accordingly, once the ampoule 70 has been back pumped, a water vapor having a pressure of about 20 Torr exists in a head space 76 above the liquid water pool 72 in the ampoule 70. The ampoule 70 is mounted directly on the chamber lid 34 to minimize the length of tubing on the walls of which water vapor is likely to condense while the gas sources 50, 54 and their mass flow controllers 52, 56 are typically mounted on a remote gas panel with somewhat long tubing 78 to the chamber 30 and its remote plasma source 60.

A controller 80 controls the operation of the variable elements of the cleaning chamber 30 such as the vacuum pump system 36, the mass flow controllers 52, 56, 74, and the remote plasma source 60. The control is performed according to a process recipe for the desired application. The recipe is recorded in a recordable medium 82, such as a CDROM, inserted into the controller 80.

In one method of using the chamber 30, the water vapor is not used in plasma cleaning the wafer 40. Instead, water vapor is pulsed into the chamber vacuum chamber 32 before the wafer is heated, before the remote plasma source 60 is turned on, and before the excited hydrogen is supplied to the vacuum chamber 32. The flow of water vapor is disconnected before the excited hydrogen is applied to the heated wafer. Water vapor has been found to deleteriously affect some types of porous low-k dielectric material so its exposure should be minimized in these cases. The small amount of water passivates the walls of the chamber and particularly the liners 66, 68 and showerhead faceplate 42 and protect them from the reducing chemistry of the hydrogen clean. Further, the passivation both lengthens the lifetime of the remote plasma source 60 and decreases the generation of particles, presumably from these walls. It also increases the performance of the pre-cleaning as measured by the photoresist etch rate and selectivity between the photoresist and low-k dielectric.

The same chamber can be adapted to deliver a remotely generated oxidizing plasma. An oxygen gas source 90 supplies oxygen gas through a mass flow controller 92 to the remote plasma source 60, which excites the oxygen into a plasma. The ion filter comprising the magnets 62, 64 removes the oxygen ions such as $O^+$ from the plasma as it diffuses within the tube liner 66 towards the manifold 56 of the showerhead faceplate 42. Thereby, principally neutral oxygen radicals O* are delivered as the excited oxidizing species into the interior of the vacuum chamber 32 to treat the wafer 40 to a soft plasma oxidization. Alternative neutral oxygen radicals include ozone $O_3$ and excited atomic states of $O_2$*. The plasma generator 60 is not completely efficient so neutral unexcited $O_2$ molecules reach the wafer but they are less effective at oxidizing than the oxygen radicals. The oxide liners 66, 66 and showerhead faceplate 42 are well adapted to the oxidizing plasma and do not usually require water passivation.

The so configured cleaning chamber 30 can be used in a number of diverse applications, some of which are described below in more detail. However, the operation of the chamber is not limited to the described process embodiments.

Residue Cleaning

The chamber of FIG. 2 may be used in a pre-cleaning step prior to barrier deposition in which residue is removed by a hydrogen plasma. Fu et al. have described hydrogen pre-cleaning process using a remote plasma source in U.S. patent application Ser. No. 11/334,803, filed Jan. 17, 2006, now published as application publication 2007/0117397, and incorporated herein by reference. Fu has described wall passivation used in a hydrogen pre-clean with such a chamber in aforementioned patent application Ser. No. 11/351,676.

Hydrogen Ashing

Yang et al. have described in U.S. patent application Ser. No. 11/737,731, filed Apr. 19, 2007, now published as application publication 2008/0261405, and incorporated herein by reference, a process that may be practiced in the chamber of FIG. 2 or an extension of it. Their process includes an initial pre-treatment of a low-k dielectric with a plasma of hydrogen and nitrogen and a main ashing step for removing photoresist with a plasma of hydrogen, water vapor, argon, and optionally methane. We believe the water vapor may introduce difficulties with the low-k dielectric.

Oxygen Stuffing of Metal Barriers

The combined cleaning chamber 30 described above can apply neutral oxygen radicals to a wafer pre-formed with a titanium barrier layer on the via sidewalls before aluminum is filled into the via. This operation is sometimes referred to as oxygen stuffing. Titanium films typically form as a polycrystalline metal having grain boundaries between the crystallites. The grain boundaries provide a diffusion path for aluminum atoms from the metallization to the underlying dielectric particularly when the titanium barrier layer is thin. When oxygen is stuffed into the grain boundaries, it blocks the diffusion path.

Similar types of oxygen stuffing may be applied to barriers of other refractory metals, such as tantalum, ruthenium, an alloy of ruthenium and tantalum, and tungsten.

This method contrasts with previously used methods of diffusing oxygen gas $O_2$ under elevated temperatures into the titanium or of depositing an oxygen-containing layer over the titanium layer and overcoating it with a titanium nitride layer. Both methods suffer from the weak bonding of the oxygen with the matrix of the titanium thin film. Yet another method includes ion implanting oxygen into the titanium film from a local. This method suffers from the relatively high energy of the incident oxygen ions, which tends to break bonds in the thin film and generate crystalline defects, such as dislocations, voids, and interstitials.

Oxygen Stuffing of Nitride Barriers

The combined cleaning chamber 30 can also apply neutral oxygen radicals to a wafer pre-formed with a nitride barrier layer, such as titanium nitride (TiN) and tantalum nitride (TaN). Atomic oxygen is highly reactive with the nitride and causes a stable barrier to immediately form.

Experiments have shown that TiN barriers treated with neutral oxygen radicals from a inductively coupled remote plasma source provides an effective barrier in a Cu-barrier-Al stack with half the thickness of a TiN barrier thermally annealed in an $O_2$ ambient. Further, the low-temperature thermally activated neutral plasma process imposes less of a heat load on the integrated circuit, increases the throughput, and produces no direct ion bombardment that potentially causes other problems.

Gases such as hydrogen ($H_2$), nitrogen ($N_2$) and water vapor may be added to the remote plasma source to modulate the recombination rate of atomic oxygen back to $O_2$.

Tungsten Oxide Reduction

Sometimes a layer of tungsten oxide (WO) needs to be removed from a developing integrated circuit. For example, after CMP has removed the excess copper or aluminum in a via and before the next level of metal is deposited, tungsten oxide needs to be removed. The tungsten oxide may be removed by a remotely generated hydrogen plasma supplying mostly hydrogen radicals as the active species to the wafer.

Figure 3:
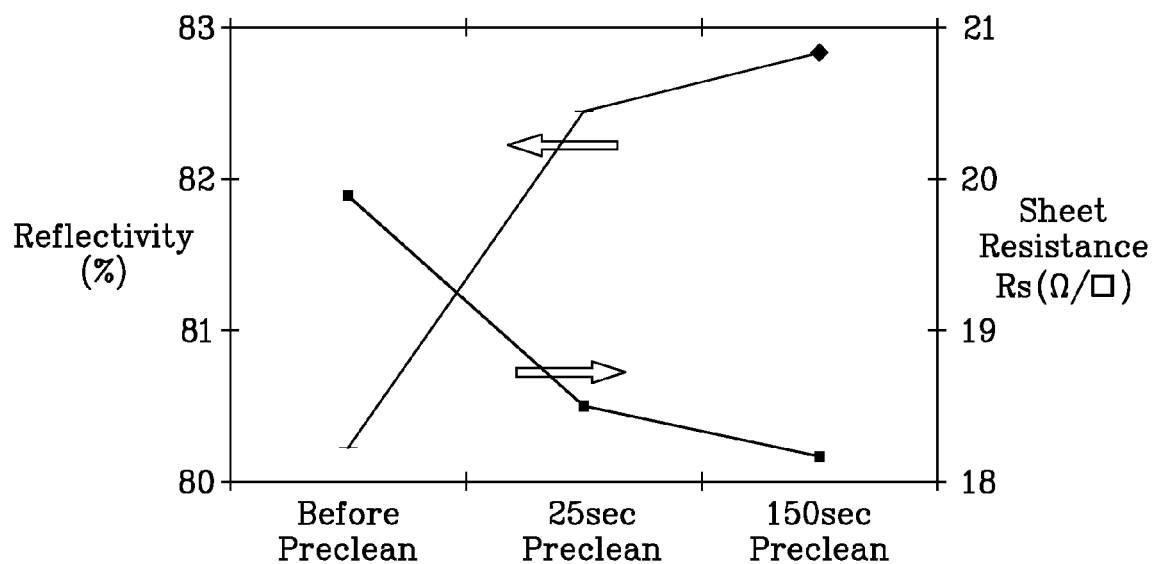
FIG. 3 is a graph showing the formation of an oxidized refractory metal.

The process was verified with a test sample including a 10 nm-thick film of tungsten which was thermally oxidized in air. The reflectivity and sheet resistance was measured for the oxidized but uncleaned sample with the results shown in the graph of FIG. 3. The sample was then pre-cleaned in the reducing environment of neutral hydrogen radicals. After 25 s of treatment, the reflectivity showed a significant increase and the sheet resistivity a significant decrease. A further pre-clean of 125 s showed further changes but not sufficient to justify the added time. That is, 25 s of reducing pre-clean is operationally sufficient in most circumstances.

In another test, a 50 nm-thick tungsten layer was sputtered onto a silica substrate and oxidized at high temperature in an oxygen plasma. Two samples were alternatively pre-cleaned or not. With or without pre-cleaning, the two samples were capped with 20 nm of sputtered tantalum. SIMS analysis shows a distinct oxygen peak between the tantalum and metallic tungsten if no pre-cleaning is performed between the oxidation and tantalum coating. With 25 s of pre-cleaning, the oxide peak is reduced by a factor of ten and there is a sharper interface between the tungsten and tantalum.

Hydroxide Film

Figure 4:
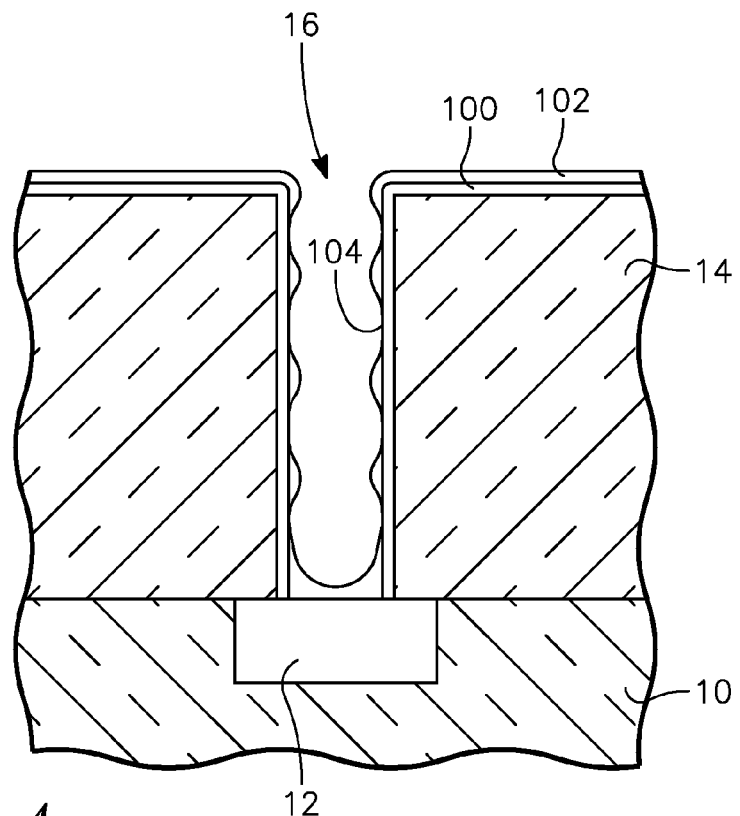
FIG. 4 is a cross-sectional view of a via illustrating the formation of oxidized tantalum oxide which may be removed according to a use of the invention.

The cleaning chamber 30 of FIG. 2 can be used to form a protective hydroxide layer on a metal, particularly a refractory metal. For example, as illustrated in the cross-sectional view of FIG. 4 a copper metallization is often formed by first sputtering a barrier layer 100 of a refractory metal such as tantalum onto sidewalls of the via 16 although preferably not its bottom and then sputtering a thin layer copper seed layer 102 over the barrier layer 100. However, the copper needs to be thin within the narrow via 16 and is likely to leave openings 104 exposing the tantalum or other refractory metal of the barrier layer 100. The exposed refractory metal is likely to oxidize to a refractory oxide such as tantalum oxide when the wafer is transferred to the plating bath. The tantalum oxide is less conductive than tantalum and thus increases the resistance of the plating electrode in ECP. Further, tantalum oxide more poorly initiates copper growth than metallic tantalum.

The hydroxide film may be formed in a two-step process upon a wafer 40 placed into the chamber 30 and containing an exposed metal layer. First, oxygen is metered from the oxygen source 90 into the remote plasma source 60 to supply neutral oxygen radicals into the chamber 32. Although the precise mechanisms are not completely understood, it is believed that the neutral oxygen radicals oxidize a thin surface layer of the refractory metal or at least are adsorbed to the metal atoms on the surface. Because the refractory metal is resistant to oxidation, the oxidation is limited to near the surface. Secondly, the flow of oxygen is stopped and hydrogen is metered from the hydrogen source 50 through the remote plasma source 60 into the vacuum chamber 32. The neutral hydrogen radicals act to partially reduce the metal oxide or at least bond with the adsorbed oxygen. However, rather than completely reacting with the oxygen to form water, the reaction produces hydroxyls —OH, which bond to the surface of the metal film and thereby form an hydroxyl or metal hydroxide film.

The hydroxide film is formed under controlled high-purity conditions and thus produces a more reliable protective film than one formed by exposure to ambient air and its water vapor.

The hydroxide film acts as a barrier to protect the metal film from extensive oxidation when the wafer is exposed to air. Further, hydroxides tend to dissolve more readily in acid electrolytes than do oxides. Accordingly, the hydroxide film is effective at allowing the quick recovery of the conductivity of thin metal films when the wafer is immersed in the electrolytic bath for processes such as copper ECP.

Although it is possible to first expose the wafer to the neutral hydrogen plasma and then the neutral oxygen plasma or to simultaneously supply both oxygen and hydrogen to the remote plasma source, it is believed that the hydroxyl formation is promoted by first oxidizing and then reducing.

The combined chamber is capable of being applied to a number of disparate applications, some of which are themselves novel, without major hardware changes. Furthermore, the combined chamber allows the use of both oxygen and hydrogen radicals in novel applications, such as the described hydroxide film.

The invention claimed is:

1. A method of treating a barrier layer, comprising the steps of:
    supporting in a vacuum chamber a substrate containing a dielectric layer and a metal barrier layer overlying the dielectric layer and comprising a refractory metal selected from the group consisting of titanium, tantalum, ruthenium, and tungsten;
    generating external to the vacuum chamber a plasma comprising oxygen;
    magnetically filtering oxygen ions from the plasma to produce neutral oxygen radicals; and
    exposing a principal surface of the metal barrier layer to the neutral oxygen radicals, whereby the exposing step stuffs oxygen into the metal barrier layer.

2. The method of claim 1, wherein the barrier layer is formed on sidewalls of a hole through the dielectric layer and further comprising a subsequent step of filling metal into the hole.

3. The method of claim 1, wherein the barrier layer comprises titanium.

4. The method of claim 1, wherein the plasma is generated in a remote plasma source and the filtering is performed in an ion filter projecting a magnetic field across a tube conveying the plasma from the remote plasma source toward the vacuum chamber.

5. The method of claim 1, wherein the refractory metal comprises tantalum.

* * * * *